US 6,555,936 B1

(12) United States Patent
Tanaka et al.

(10) Patent No.: US 6,555,936 B1
(45) Date of Patent: *Apr. 29, 2003

(54) FLATMOTOR DEVICE AND EXPOSURE DEVICE

(75) Inventors: Keiichi Tanaka, Funabashi (JP); Andrew Hazelton, San Carlos, CA (US)

(73) Assignee: Nikon Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/450,772

(22) Filed: Nov. 30, 1999

(30) Foreign Application Priority Data

Dec. 4, 1998 (JP) ............................................. 10-345429

(51) Int. Cl.[7] .......................... H02K 9/19; H02K 41/00
(52) U.S. Cl. ........................................................ 310/12
(58) Field of Search .............................. 310/12, 13, 14, 310/58, 60 A, 64, 65

(56) References Cited

U.S. PATENT DOCUMENTS

| 5,196,745 | A |   | 3/1993  | Trumper ................. 310/12 |
| 5,502,311 | A |   | 3/1996  | Imai et al. ............. 250/548 |
| 5,561,334 | A | * | 10/1996 | Ishida et al. ............. 310/62 |
| 5,925,956 | A |   | 7/1999  | Ohzeki .................. 310/90.5 |
| 6,072,183 | A | * | 6/2000  | Itoh et al. ............. 250/492.2 |
| 6,114,781 | A | * | 9/2000  | Hazelton et al. .......... 310/12 |
| 6,304,011 | B1| * | 10/2001 | Pullen et al. ............. 310/52 |

FOREIGN PATENT DOCUMENTS

| EP | A1-0 951 054 | 10/1999 |
| JP | A-5-190423   | 7/1993  |
| JP | A-10-214783  | 8/1998  |

* cited by examiner

Primary Examiner—Nestor Ramirez
Assistant Examiner—Judson Jones
(74) Attorney, Agent, or Firm—Oliff & Berridge PLC

(57) ABSTRACT

To provide a flat motor device capable of suppressing a thermal effect on a peripheral environment. When currents are supplied to armature coils 34 confronting a pole unit 40, a wafer stage WST is driven along a moving surface 32a by electromagnetic force. With this operation, the armature coils 34, to which the respective currents are supplied, generate heat. The armature coils 34 are disposed in the interior of a base 32 along the moving surface. A first fluid passage 62, in which a first fluid flows in a laminar flow state, is disposed to the armature coils on the moving surface side thereof and a second fluid passage 64, in which a second fluid flows in a transition flow state, is disposed thereto on the side opposite to the moving surface, respectively. Therefore, a temperature boundary layer is formed in the flow of the first fluid, whereby the transmission of the heat of the armature coils 34 to the moving surface is effectively prevented as well as the heat can be effectively removed from the armature coils 34 by the second fluid by an increase in the heat transfer coefficient between the second fluid and a stator yoke 58.

17 Claims, 9 Drawing Sheets

FLATMOTOR DEVICE AND EXPOSURE DEVICE

DETAILED DESCRIPTION OF THE INVENTION

1. Industrial Field of the Invention

The present invention relates to a flat motor and an exposure device, and more particularly, to a flat motor for driving a moving element (slider) two-dimensionally by electromagnetic force and to an exposure device using the flat motor for a substrate stage unit.

2. Description of the Related Art

Conventionally, exposure devices are used in a lithography process for manufacturing semiconductor devices, liquid crystal devices and the like to transfer a pattern formed on a mask or a reticle (hereinafter, generically called "reticle") onto a substrate such as a wafer, a glass plate or the like, on which a resist of the like is coated, through a projecting optical system.

In the exposure device, a wafer is held on a wafer holder by vacuum adsorption or the like because it must be positioned at an exposing position with pinpoint accuracy, and the wafer holder is secured on a wafer table.

Conventionally, a drive unit composed of a rotating type motor and a conversion mechanism for converting a rotating motion to a linear motion is often used as a drive unit for moving an object to be controlled such as the wafer table and the like on a straight line or a plane or positioning the object at a target position. Recently, however, a stage unit has been developed for positioning an object to be controlled by driving it two-dimensionally in a contact-free fashion so that the object to be controlled can be positioned at a higher speed with pinpoint accuracy without being affected by the accuracy of a mechanical guide surface and the like and that the life of the stage unit can be increased by the avoidance of mechanical friction. A variable-magnetic-resistance drive type flat motor is known as the drive source of the non-contact drive type stage unit.

At present, the variable-magnetic-resistance drive type flat motor is mainly arranged by coupling the two axes of variable-magnetic-resistance drive type linear pulse motors as in a Sawyer motor. The variable-magnetic-resistance drive type linear pulse motor includes a stator, which is composed of a sheet-shaped magnetic body having, for example, uneven tooth portions formed thereon along a lengthwise direction at equal intervals and a slider, which is composed of a plurality of armature coils confronting the uneven tooth portions of the stator, having uneven portions whose phase is different from that of the above uneven tooth portions and coupled through permanent magnets. Then, the slider is driven making use of force generated so as to minimize a magnetic resistance between the stator and the slider at each timing. That is, the slider is advanced stepwise by regulating and controlling the current values and the phases of pulse currents supplied to the respective armature coils.

PROBLEMS TO BE SOLVED BY THE INVENTION

In the variable-magnetic-resistance drive type flat motor, it is necessary to obtain large drive force to realize positioning at a high speed by using it in a precise positioning unit. For this purpose, a large current must be necessarily flown to armature coils. As a result, a large problem is arisen in the heat generated from the armature coils.

However, since the armature coils are not cooled in the variable-magnetic-resistance drive type flat motor at present, it is difficult to apply the flat motor to the precise positioning unit.

Further, there has been also developed a flat motor which is obtained by two-dimensionally developing a linear motor and driven by Lorentz electromagnetic force (for example, U.S. Pat. No. 5,196,745). It is said that the Lorentz electromagnetic-force type flat motor is promising as a stage drive source in future because it is excellent in controllability, thrust force linearity and positioning characteristic.

However, a large current must be flown to armature coils also in the Lorentz electromagnetic-force flat motor to obtain a large amount of thrust force and thus the armature coils act as a heat generating source. Therefore, the environment of a precise positioning device is taken into consideration, it is indispensable to design a cooling system to realize a flat motor in which a thermal effect is lowered.

Further, in the Lorentz electromagnetic-force-drive flat motor and the like, an armature unit including armature coils is usually arranged as a stator for the convenience of supplying a current to the armature coils. However, when the flat motor arranged as described above is employed as the drive source of the substrate stage of a projecting/exposing device including a projecting optical system, the stator is often physically secured to a main body column by which the projecting optical system is held. In this case, the projecting optical system is oscillated by the reaction force acting on the stator when a slider is driven, which results in the dislocation of a position to which a pattern is transferred and the deterioration of uniformity of a line width. However, since the exposure device using the flat motor is now at the start of its development, a mechanism for not transmitting the reaction force acting on the stator such as the armature unit and the like to a structural member for supporting it is not yet known.

A first object of the present invention, which was made in the above circumstances, is to provide a flat motor cable of suppressing a thermal effect on a peripheral environment.

A second object of the present invention is to provide an exposure device capable of carrying out exposure with pinpoint accuracy while maintaining a high throughput.

MEANS FOR SOLVING THE PROBLEMS

A flat motor device according to the invention described in claim 1 is characterized by comprising a moving unit (40, 42) moving along a predetermined moving surface; and a fixed unit (32) having the moving surface formed on the side thereof confronting the moving unit, wherein one of the moving unit and the fixed unit includes a pole unit (40); and the other of the moving unit and the fixed unit includes armature coils (32), a heat insulating chamber (62) disposed to the armature coils on the moving surface side thereof and a cooling chamber (64) disposed to the armature coils on the side thereof opposite to the moving surface.

According to the flat motor device, when currents are supplied to the armature coils constituting the moving unit or the fixed unit, the moving unit is moved along the moving surface by the electromagnetic force generated by electromagnetic interaction between the armature coils and (the magnets constituting) the pole unit. When the moving unit is to be continuously moved in a certain direction, currents are supplied to the armature coils which confront the pole unit (magnets) (in the case of a moving magnet type) or to all the armature coils (in the case of a moving coil type) in accordance with the moving position of the moving unit. With this operation, the armature coils to which the respective currents are supplied generate heat. In this case, the heat insulating chamber is disposed to the armature coils on the moving surface side thereof and the cooling chamber is disposed thereto on the side thereof opposite to the moving surface, respectively. As a result, the transmission of the heat generated by the armature coils to the moving surface side is suppressed or prevented by the heat insulating action of the heat insulating chamber, and the armature coils are cooled by the cooling chamber. Therefore, the armature coils can be cooled as well as the effect of the heat generated by the armature coils on a peripheral environment can be suppressed.

In this case, various types of heat insulating and cooling methods can be contemplated and various arrangements of the heat insulating chamber and the cooling chamber can be contemplated accordingly. For example, as shown in the invention described in claim 2, the interiors of the heat insulating chamber (62) and the cooling chamber (64) may be arranged as flow passages in which fluids having different flow conditions flow. In this case, the armature coils can be cooled from the side opposite to the moving surface by the heat exchange with the fluid in the cooling chamber as well as the transmission of the heat generated by the armature coils to the moving surface side can be suppressed or prevented by the heat insulating action of the of the fluid in the heat insulating chamber similarly to the invention described in claim 1 so as to suppress a thermal effect on the peripheral environment by flowing the same or different fluids having different flow conditions in the flow passages of the heat insulating chamber and the cooling chamber.

In this case, as shown in the invention described in claim 3, the flat motor device may include a fluid supply device (102) for supplying first and second fluids into the first and second fluid passages by regulating flow states so that the flow of the fluid in the interior of the heat insulating chamber is made to a laminar flow and the flow in the interior of the fluid in the cooling chamber is made to an approximate transition flow. In this case, the transmission of heat to the moving surface side can be effectively prevented by the formation of a temperature boundary layer in the flow of the first fluid in the heat insulating chamber as well as heat can be effectively removed from the armature coils by the second fluid because the heat transfer coefficient between the second fluid in the cooling chamber and the wall on the armature coils side is increased.

In this case, as shown in the invention described in claim 4, it is preferable that the fluid supply device (102) supplied the fluids into the respective flow passages so that the flowing direction of the fluid flowing in the heat insulating chamber (62) and the flowing direction of the fluid flowing in the cooling chamber (64) are made to the same direction or an opposite direction. When the flowing direction of the fluid flowing in the heat insulating chamber is the same as the flowing direction of the fluid flowing in the cooling chamber, one of the moving unit and the fixed unit which includes the armature coils can be approximately uniformly cooled. Further, when the flowing direction of the fluid flowing in the heat insulating chamber is opposite to the flowing direction of the fluid flowing in the cooling chamber, the temperature of the one of the units can be lowered as a whole.

In the respective inventions described in claims 2–4, the fixed unit may include a first wall (57) having the moving surface formed on one side thereof and a deformation preventing member (56a, 68) for supporting the first wall from the other side thereof as shown in the invention described in claim 5. In the case of an air floating type flat motor device, a moving surface on a fixed unit side ordinarily also act as an air guide. In this case, since a first wall on which a moving surface is disposed is supported by a deformation preventing member, the moving surface is arranged as a rigid structure capable of resisting against an air pressure, whereby a moving unit can be supported with highly rigidity.

In this case, as shown in the invention described in claim 6, when the fixed unit (32) includes, in the interior thereof, the armature coils (34) disposed along the moving surface (32a), the heat insulating chamber (62) disposed to the armature coils on the moving surface side thereof and the cooling chamber (64) disposed to the armature coils on the side thereof opposite to the moving surface side, it is preferable that the cross-sectional shape of the deformation preventing member (56a, 68) is formed to a wing shape in the flow passage portion thereof in the heat insulating chamber (62). This is because that while the flows of the first and second fluids may be disturbed by the deformation preventing member which is located in the flows of the first and second fluids in the heat insulating chamber and the cooling chamber, it can be suppressed that the fluid in the fluid passage in the heat insulating chamber is made to a transition flow state or to a turbulent flow state in such a case.

In this case, a plate-shaped partition member (60) may be disposed to the armature coils (34) on the moving surface (32a) side thereof, and the flow passage (62) in the heat insulating chamber may be formed between the first wall (57) having the moving surface formed on the one side thereof and the partition member as shown in the invention described in claim 7.

In the respective inventions described in claims 2–7, a temperature controller (106, 108) may be provided to pre-control the temperatures of the respective fluids to temperatures lower than the atmospheric temperature of the base (32) as shown in the invention described in claim 8. In this case, heat can be more effectively removed from the armature coils.

In the respective inventions described in claims 1–8, the flat motor device may further include a holding member (56B, 72) isolated from the first member (56A) having the moving surface (32a) formed thereon with respect to oscillation for holding the armature coils or the pole unit constituting the fixed unit (32) as shown in the invention described in claim 9. In this case, when the moving unit is moved, the reaction force thereof acts on the armature coils or the pole unit constituting the fixed device. However, since the armature coils or the pole unit is held by the holding member which is isolated from the first member with reference to oscillation, the reaction force is not transmitted to the first member through the armature coils or the pole unit. Therefore, the oscillation of the first member (moving surface) caused by the drive of the moving unit can be prevented.

In the invention described in claim 10, a flat motor device provided with a moving element (40, 42), which is moved along a predetermined surface (32a) by electromagnetic force, and a base (32), which includes a first member (56A) having the moving surface formed on the side thereof confronting the moving element and a stator (34, 58) disposed in the interior thereof along moving surface, is characterized in that one of the moving element and the stator includes a pole unit and the other of the moving element and the stator includes armature coils, and the flat motor device includes a holding member (56B, 72) isolated from the first member with respect to oscillation for holding the stator.

According to the flat motor device, when the moving element is moved along the moving surface by the electromagnetic force, the stator in the base receives the reaction force thereof. However, since the stator is held by the holding member which is isolated from the first member, on which the moving surface is formed, with respect to oscillation, the reaction force is only transmitted to the ground (floor surface) through the stator and the holding member and is not transmitted to the first member. Therefore, the oscillation of the first member (moving surface) caused by the drive of the moving element can be prevented.

The invention described in claim 11 is an exposure device for transferring a predetermined pattern onto a substrate which is characterized in that the exposure device uses the flat motor device according to any one of claims 1–10 for a substrate stage unit for driving the substrate.

According to the exposure device, since the flat motor device according to any one of claims 1–10 is used for the substrate stage unit, the substrate can be driven in a contact-free fashion by electromagnetic force and further a thermal effect resulting from the heat generated by the armature coils can be effectively reduced. The fluctuations in air of the beams of an interferometer for measuring the position of a wafer, and the like can be suppressing thereby. Accordingly, the position of a substrate can be precisely controlled at a high speed, and, as a result, exposure can be carried out with high exposing accuracy while enhancing a throughput. In particular, in a projecting exposure device including a projecting optical system, it is preferable to use the flat motor device according to claim 9 or 10 to a substrate stage unit. In this case, even if a first member on which a moving surface is disposed is secured to a main body column for holding the projecting optical system, the first member and the main body column and further the projecting optical system held by the main body column are not oscillated by the reaction force acting on a fixed unit (stator) when a substrate stage including a moving unit (moving element) is moved. As a result, the dislocation of a pattern transferred position, the deterioration of the uniformity of a line width, and the like are not caused, whereby exposing accuracy can be more enhanced.

DESCRIPTION OF THE EMBODIMENT

An embodiment of the present invention will be described below based on FIGS. 1 to 7. FIG. 1 schematically shows an overall arrangement of an exposure device 100 of an embodiment in which a flat motor device according to the present invention is used for a substrate stage unit. The exposure device 100 is a scanning type exposure device employing a so-called step and scan exposure system. As described later, a projecting optical system PL is provided in the embodiment. Thus, in the following description, the optical-axis AX direction of the projecting optical system PL is called a Z-axis direction, a direction in which a reticle R and a wafer W are relatively scanned in a plane perpendicular to the Z-axis direction is called a Y-axis direction and a direction perpendicular to Z- and Y-axes is called an X-axis direction.

The exposure device 100 includes an illuminating optical system 10, a reticle stage RTS for holding the reticle R as a mask, the projecting optical system PL, a main body column 12 for holding the reticle stage RTS and the projecting optical system PL, a base plate BP, a substrate stage unit 30 for driving the wafer W as a substrate in an XY-plane, and the like.

Actually, the exposure device 100 is accommodated in a not shown environmental chamber which is arranged such that the interior temperature and humidity thereof are regulated with pinpoint accuracy and the invention of dusts thereinto is highly prevented. A not shown KrF excimer laser light source (or ArF excimer laser light source), which generates pulse ultraviolet light having a wavelength of 248 nm (or 193 nm), is used as the exposure light source of the exposure device. The excimer laser light source is actually installed in a service room whose degree of cleanness is lower than that of an ultraclean room in which the exposure device 100 is installed. The excimer laser light source is connected to the illuminating optical system 10 through a not shown beam matching unit.

As shown in, for example, Japanese Unexamined Patent Publication No. 10-214783, the illuminating optical system 10 is composed of a shutter, a beam expander, a secondary light source forming optical system (fly's eye lens system), an oscillation mirror, a condensing lens system, a reticle blind, an imaging lens system and the like (all of them not shown) and illuminates a rectangular (or arc) illuminating region IAR on the reticle R with exposing illuminating light (pulse ultraviolet light) in a uniform intensity of illumination.

The reticle R is fixed on the reticle stage RST by, for example, vacuum adsorption. The reticle stage RST can be moved by a reticle drive unit 15 (not shown in FIG. 1, refer to FIG. 6) composed of a linear motor and the like on a reticle base plate 14 in a predetermined scanning direction (Y-axis direction here) at a designated scanning speed. Note that the reticle drive unit 15 includes a moving element (slider) connected to the reticle stage RST and a stator which cooperates with the moving element (for example, generates electromagnetic force by electromagnetic interaction). The stator is disposed on a frame (omitted in the figure) which is isolated from the main body column 12 with reference to oscillation. As a result, when the reticle stage RTS is driven, the reaction force acting on the stator is not transmitted to the main body column 12. Further, the reticle stage RTS can be finely driven in the Y-axis direction, X-direction and a θz-direction (rotating direction about the Z-axis direction) in the XY-plane. The reticle base plate 14 constitutes a portion of the main body column 12 which will be described later.

The position of the reticle stage RST in a moving plane is always detected by a reticle laser interferometer (hereinafter, referred to as "reticle interferometer") 16 as a position detector fixed on the reticle base plate 14 with resolution of, for example, about 0.5–1 nm. The position information of the reticle stage RTS from the reticle interferometer 16 is supplied to a controller 50 (omitted in FIG. 1, refer to FIG. 6). The controller 50 drives the reticle stage RTS through the reticle drive unit 15 based on the position information of the reticle stage RTS. Note that, as described above, since the reaction force generated when the reticle stage RTS is driven is not transmitted to the main body column 12, a position can be detected with pinpoint accuracy without causing any inconvenience even if the reticle interferometer 16 is disposed on the reticle base plate 14.

The projecting optical system PL is disposed below the reticle stage RTS in FIG. 1 with its optical-axis AX direction set in the Z-axis direction. Here, a reflection optical system composed of a plurality of lens elements are used which are disposed at predetermined intervals along the optical-axis AX direction to realize both-side-telecentric-disposition. The projecting optical system PL is a reduction optical system having a predetermined projecting magnification of, for example, 1/5 (or 1/4). As a result, when the illuminating region IRA of the reticle R is illuminated with the illuminating light IL from the illuminating optical system 10, the reduced image (partially inverted image) of the circuit pattern in the illuminating region IAR of the reticle R is formed in the exposing region IA, which is conjugate to the illuminating region IAR, on the wafer W having a photo resist coated on a surface thereof with illuminating light having passed through the reticle R through the projecting optical system PL.

The main body column 12 includes a first column 22 and a second column 24. The first column 22 is placed on the upper surface of a base plate BP which acts as the reference of the device installed on a floor surface FD through a plurality of vibration proof tables 18 (4 sets in this case), and the second column 24 is disposed above the first column 22 so as to surround the projecting optical system PL.

The first column 22 includes 4 pillars 25, which are mounted on the 4 vibration proof tables 18, respectively and extend in a vertical direction (however, 2 columns on the front side in the figure are omitted) and a lens-barrel surface plate 26, through which the upper end surfaces of the 4 columns 25 are coupled with each other.

The second column 24 includes 4 legs, which are disposed on the upper surface of the lens-barrel surface plate 26 along a vertical direction so as to surround the projecting optical system PL and a top plate for coupling the upper ends of the 4 legs 28 to each other, that is, the reticle base plate 14.

The lens-barrel surface plate 26 has an opening 26a, which is circular when observed in a plan view, formed at the center thereof, and the projecting optical system PL is inserted into the opening 26a from the upper side thereof. A flange 29 is disposed at a position of the projecting optical system PL a little lower than the center thereof in a height direction. The projecting optical system PL is supported from the lower side thereof by the lens-barrel surface plate 26 through the flange 29.

In the embodiment, the fine oscillation transmitted from the floor surface FD to the main body column 12 is isolated by the 4 vibration proof tables 18 in a micro G level. Note that a recessed portion is formed on the inner surface in the Y-axis direction of each of the 4 columns 25 constituting the main body column 12. The recessed portion has such a shape and size that the 4 columns 25 hold the one end and the other end in the Y-axis direction of the base 32 constituting a substrate stage unit 30 to be described later from upper and lower sides in a contact-free fashion.

The substrate stage unit 30 includes a moving surface 32a formed on the upper surface thereof in parallel with the XY-plane as well as the base 32 and a wafer stage WST. The base 32 has a plurality of armature coils 34 in the interior thereof and acts as a fixed unit, and the wafer stage WST moves in the XY-plane along the moving surface 32a while holding the wafer W.

The wafer stage WST includes a substrate table 36, support mechanisms 38a, 38b and 38c, a pole unit 40 and an air slider 42. The substrate table 36 holds the wafer W by, for example, vacuum adsorption or the like. The support mechanisms 38a, 38b and 38c support the substrate table 36 at 3 different points and include voice coil motors and the like for driving the substrate table 36 in the Z-axis direction and in a direction inclining with respect to the XY-plane. The pole unit 40 has these 3 support mechanisms 38a, 38b and 38c and the substrate table 36 mounted thereon. The air slider 42 floats and supports the pole unit 40, the support mechanisms 38a, 38b and 38c and the substrate table 36 as a whole above the moving surface 32a with a clearance of several microns. Although omitted in FIG. 1, the support mechanisms 38a–38c are actually independently driven and controlled by the controller 50 (refer to FIG. 6).

The air slider 42 is a kind of an air static pressure bearing unit having, for example, a cross-in-square shape when observed on a plan view. Although omitted in the figure, the air slider 42 has a pressurized air supply passage, a vacuum passage and the like formed therein. The pressurized air supply passage is connected to a not shown air pump through a not shown tube. Further, the vacuum passage is connected to a not shown vacuum pump through a not shown tube. In contrast, an air pad connected to the pressurized air supply passage and an air pocket connected to the vacuum passage are disposed on the bottom surface of the air slider 42, respectively.

The pole unit 40 is arranged by including a magnetic body plate having, for example, the support mechanisms 38a, 38b and 38c mounted on the upper surface thereof and a thrust force generating magnet composed of 4 permanent magnets disposed on the lower surface (surface confronting the moving surface 32a) of the magnetic body plate in a 2×2 matrix in row and column directions. The pole unit 40 is arranged integrally with the air slider 42 in such a manner that the 4 thrust force generating magnets thereof are engaged with the respective openings which form the cross-in-square shape of the air slider 42 from the upper side thereof. In this case, each of the 4 thrust force generating magnets is composed of a permanent magnet having the same thickness, the same shape and a square pole surface. Then these 4 thrust force generating magnets are disposed on the same plane in a 2×2 matrix in row and column directions so that the gap between thrust force generating magnets which are adjacent to each other in the row and column directions, that is, in both the X- and Y-directions has a predetermined width. Then, the thrust force generating magnets adjacent in the X-direction and the thrust force generating magnets adjacent in the Y-direction have an opposite polarity on the pole surfaces thereof, respectively. The moving unit as the moving element (slider) of the flat motor device is arranged by the pole unit 40 and the air slider 42 arranged as described above.

In the embodiment, the thickness of the air layer between the air slider 42 and the moving surface 32a, that is, the gap of the bearing is maintained to a desired value by the balance between downward force and upward force. The downward force corresponds to the sum of the dead load of the entire wafer stage WST, the magnetic suction force between the thrust force generating magnets (permanent magnets) constituting the pole unit 40 and a stator yoke 58 to be described later and the vacuum suction force (pre-load force) applied by the not shown vacuum pump. In contrast, the upward force results from the pressure of the pressurized air which is supplied from the air pump and blown out to the moving surface 32a through the air pad, that is, the upward force is the static force of the air layer between the bottom of the wafer stage WST and the moving surface 32a (so-called pressure in a gap). As described above, the air slider 42 constitutes a kind of a vacuum pre-load type air static pressure bearing. The wafer stage WST is entirely floated and supported above the moving surface 32a with a clearance of, for example, about 5 $\mu$m by the air slider 42 (refer to FIG. 1).

In the embodiment, while the air slider 42 is provided with the pressurized air passage, the vacuum passage and the air pad and the air pocket connected thereto, respectively, it is not necessarily provided with the vacuum passage and the like.

The substrate table 36 includes a moving mirrors 48Y and 48X disposed thereon. The moving mirror 48Y has a reflecting surface perpendicular to the Y-axis direction as a scanning direction, and the moving mirror 48X has a reflecting surface perpendicular to the X-axis direction as a non-scanning direction. The position of the substrate table 36 in the XY-plane is always detected by a wafer laser interferometer (hereinafter, referred to as "wafer interferometer") 46 as a position detecting unit through the moving mirrors 48X and 48Y with resolution of, for example, about 0.5–1 nm. In this case, the reaction force generated when the wafer stage WST is driven is not transmitted to the main body column 12 as described later, the wafer interferometer 46 is fixed on the upper surface of the base 32. Actually, the wafer interferometer 46 is composed of a wafer X interferometer 46X for measuring the position of the substrate table 36 in the X-direction based on the reflected light of a length measuring beam irradiated on the moving mirror 48X and a wafer Y interferometer 46Y for measuring the position of the substrate table 36 in the Y-direction based on the reflected light of a length measuring beam irradiated on the moving mirror 48Y (refer to FIG. 6). However, they are typically shown as the wafer interferometer 46 in FIG. 1.

The position information (or the speed information) of the substrate table 36 is supplied to the controller 50 which controls the movement of the substrate table 36 in the XY-plane based on the position information (or the speed information).

Next, the arrangement of the base 32 constituting the fixed unit of the flat motor device will be described in detail based on FIGS. 2 to 4. FIG. 2 shows a plan view of the substrate stage unit 30, FIG. 3 shows an enlarged view of the base 32 portion in FIG. 1 and FIG. 4 shows an exploded view for explaining how the base 32 is assembled.

As shown in FIG. 2, the above base 32 is composed of a base main body 52 which is formed to a square shape when observed on a plan view and a pair of joint mounting members 54A and 54B mounted on the base main body 52 at both the ends thereof in the X-axis direction.

As shown in FIG. 2 and FIG. 3, the base main body 52 includes a vessel 56, the stator yoke 58, the armature coils 34 and a film 60 as a partition member. The vessel 56 is composed of a hollow box-shaped non-magnetic material such as ceramic or the like which has a square shape, when observed on a plan view, and a rectangular longitudinal cross-section as a whole. The stator yoke 58 is formed to a flat-sheet shape and composed of a magnetic material which is disposed in parallel with the bottom wall of the vessel 56 through a predetermined void (a void of, for example, about 2 mm) therefrom and has a high heat conductivity, specifically a heat conductivity of at least 30 [W/(m.K)]. The armature coils 34 of n×n pieces (FIG. 3 shows a case in which n=3) are disposed on the upper surface of the stator yoke 58 in a square matrix in X- and Y-two-dimensional directions. The film 60 is composed of a non-magnetic material such as plastic or the like and disposed in the state that they are separated from the upper surfaces of the armature coils 34 through a clearance of, for example, about several microns to several hundreds of microns and through a predetermined void (for example, a void of about 2 mm) from the ceiling wall 57 (upper wall) as a first wall in parallel therewith (refer to FIG. 5). A reason why the film 60 is not in contact with the respective armature coils 34 is to prevent the heat generated in the armature coils 34 from being directly transmitted to the film 60.

In this case, a first fluid passage 62 is formed in the space between the ceiling wall 57 of the vessel 56 and the film 60. Further, a second fluid passage 64 is formed in the space between the bottom wall of the vessel 56 and the stator yoke 58.

Hollow square coils are used as the above respective armature coils 34. The intervals at which these armature coils 34 are disposed satisfy a predetermined relationship with the intervals at which the above thrust generation magnets are disposed.

The moving surface 32a of the wafer stage WST is formed on the surface (upper surface) of the ceiling wall 57 of the vessel 56 on the side thereof confronting the wafer stage WST.

As shown in FIG. 3, n×n pieces (n=3 in FIG. 3) of projections 56a are formed on the surface (lower surface) of the ceiling wall 57 of the vessel 56 which is opposite to the moving surface 32a. These projections 56a are disposed at positions corresponding to the centers of the hollow portions of the respective armature coils 34 in the assembled state shown in FIG. 3. The outer shape of the lateral cross-section of each projection 56a is formed to a wing shape which extends slenderly in the X-axis direction here. Specifically, it is formed to a shape obtained by reducing the scale of a streamline flow wing used as an aircraft wing (for example, NACA 64 A218). A reason why such as wing shape is employed will be described later. Recesses 56b, which have a circular cross-section and a predetermined depth, are formed at the respective projections 56a at approximate centers thereof. Nuts 66 are buried into the inner bottom surfaces of the recesses 56b.

Circular openings, whose diameter is slightly larger than that of the recesses 56b, are formed on the film 60 at positions confronting the respective projections, respectively. Then, one ends (upper ends) of hollow columns 68 are inserted into the recesses 56b with force from the lower side thereof through the respective circular openings of the film 60. The respective hollow columns 68 have collar portions (flange portions) formed at a predetermined height thereof to clamp the film 60 between the projection 56a and them.

Circular openings 58a and circular openings 58b each having the same diameter are formed on the bottom surfaces of the stator yoke 58 and the vessel 56 at positions confronting the above respective projections 56a, respectively. In this case, ring-shaped spacers 70, which are coaxial to these circular openings 58a and 56c and have the same diameter as that of them, are interposed between the bottom wall of the stator yoke 58 and the bottom wall of the vessel 56 in correspondence to the respective circular openings 58a and 56c. That is, a series of round holes, which have a circular cross-section and extend upward and downward in a predetermined length, are formed by the inner peripheral surfaces of the respective circular openings 58a, the spacers 70 and the inner peripheral surfaces of the respective circular openings 56c. Then, the other ends (lower ends) of the hollow columns 68 project to the outside from the bottom surface of the vessel 56 through the round holes.

One ends of a plurality of support columns 72 (6 pieces here) disposed at predetermined intervals are fixed on the lower surface side of the bottom wall of the vessel 56, and the other ends thereof are fixed to the floor surface FD through openings formed through the base plate BP (refer to FIG. 1).

The upper surface of a plate-shaped fixing member 74, which has stepped circular openings 74a formed thereon at predetermined intervals, is in press-contact with the other end surfaces of the respective columns 68. Bolts 76 are inserted into the hollow portions of the columns 68 from the lower sides thereof through the respective circular openings 74a of the fixing member 74 and screwed through the above nuts 66.

As apparent from the above explanation, in the embodiment, a deformation preventing member is arranged by the plurality of columns 68 and the projections 56a into which the respective columns 68 are inserted with force in order to support the ceiling wall 57 of the vessel 56 as a first wall from the lower side thereof to prevent the deformation thereof. Note that it is possible to form the ceiling wall 57 to an entirely flat shape having no projection and to compose the deformation preventing member of columnar members having the projections 56a arranged integrally with the columns 68.

The base main body 52 is arranged as described above and the vessel 56 is apparently arranged as a single vessel. Actually, however, the vessel 56 can be separated into two portions along approximately the center thereof in a height direction as a boundary (refer to FIG. 4). That is, in the embodiment, the vessel 56 is composed of an upper member 56A as a first member and a lower member 56B as a second member which are obtained by dividing the hollow box-shaped vessel into two portions in the height direction thereof as shown in FIG. 4. Then, in the state before assembly, the film 60, the columns 68 and the like are tentatively fixed to the upper member 56A and arranged integrally therewith, whereas the stator yoke 58, the armature coils 34 and the like are assembled to the lower member 56B. In addition, the first fluid passage 62 is formed on the upper member 56A side and the second fluid passage 64 is formed on the lower member 56B side.

That is, the support columns 72 supports the armature coils 34, the stator yoke 58 and the lower member 56B in isolation from the base plate BP (main body column 12) with reference to oscillation. Note that in the state after the assembly is finished (complete state) shown in FIG. 1 and FIG. 3, the upper member 56A, the film 60, the columns 68 and the fixing member 74 are supported by the main body column 12 (on the base plate BP side).

the pair of joint mounting members 54A and 54B are mounted on the base main body 52 integrally therewith by welding or the like. Actually, these joint mounting members 54A and 54B are composed of upper mounting members 54A$_1$ and 54B$_1$ which are arranged integrally with the upper member 56A of the vessel 56, respectively and lower mounting members 54A$_2$ and 54B$_2$ which are arranged integrally with the lower member 56B, respectively.

A plurality of screw holes 78a and 78b, whose axial directions are set in the X-direction and which have predetermined depths, are formed through the upper mounting members 54A$_1$ and the lower mounting members 54A$_2$ of the joint mounting member 54A on the one side, respectively at predetermined intervals along the lengthwise direction thereof (refer to FIG. 2). Similarly, a plurality of screw holes 78c and 78d, whose axial directions are set in the X-direction and which have predetermined depths, are formed through the upper mounting members 54B$_1$ and the lower mounting members 54B$_2$ of the joint mounting member 54B on the other side, respectively at predetermined intervals along the lengthwise direction thereof (refer to FIG. 2).

As shown in FIG. 4, formed on the upper mounting members 54A$_1$ on one side, respectively are grooves 80a whose one ends communicate with the respective screw holes 78a, whose size in a height direction (Z-direction) is linearly reduced from one side to the other side in the X-direction thereof when observed on a side elevational view and whose cross-section is formed to a right-angled-triangle shape. A through hole 82a, whose height and Y-directional width are the same as those of the first fluid passage 62 and whose cross-section is formed to a slender rectangular shape, is formed on the side wall of the upper member 56A of the vessel 56 on one side in the X-direction thereof. The above respective grooves 80a communicate with the first fluid passage 62 through the through hole 82a. The end of the film 60 on one side in the X-direction thereof is in intimate contact with the inner bottom surfaces of the respective grooves 80a.

Similarly, as shown in FIG. 4, formed on the upper mounting members 54B$_1$ on the other side, respectively are grooves 80c whose one ends communicate with the respective screw holes 78c, whose size in a height direction (Z-direction) is linearly reduced from the other side to one side in the x-direction thereof when observed on a side elevational view and whose cross-section is formed to a right-angled-triangle shape. A through hole 82c similar to the above through hole 82a is formed on the side wall of the upper member 56A of the vessel 56 on the other side in the X-direction thereof. The above respective grooves 80c communicate with the first fluid passage 62 through the through hole 82c. The end of the film 60 on the other side in the X-direction thereof is in intimate contact with the inner bottom surfaces of the respective grooves 80c.

Further, as shown in FIG. 4, formed on the lower mounting members 54A$_2$ on one side, respectively are grooves 80b whose one ends communicate with the respective screw holes 78b, whose size in a height direction (Z-direction) is linearly reduced from one side to the other side in the X-direction thereof when observed on a side elevational view and whose cross-section is formed to a right-angled-triangle shape. A through hole 82b, whose height and Y-directional width are the same as those of the second fluid passage 64 and whose cross-section is formed to a slender rectangular shape, is formed on the side wall of the lower member 56B of the vessel 56 on one side in the X-direction thereof. The above respective grooves 80b communicate with the second fluid passage 64 through the through hole 82b.

Similarly, as shown in FIG. 4, formed on the lower mounting members 54B$_1$ on the other side, respectively are grooves 80d whose one ends communicate with the respective screw holes 78d, whose size in a height direction (Z-direction) is linearly reduced from the other side to one side in the X-direction thereof when observed on a side elevational view and whose cross-section is formed to a right-angled-triangle shape. A through hole 82d similar to the above through hole 82b is formed on the side wall of the lower member 56B of the vessel 56 on the other side in the X-direction thereof. The above respective grooves 80d communicate with the second fluid passage 64 through the through hole 82d.

As apparent from the plan view of FIG. 2, the flat-cross-sections of the respective grooves 80a and the respective grooves 80b are formed to an isosceles-triangular-shape whose Y-directional width is linearly increased from one side to the other side in the X-direction. That is, the cross-sectional-areas of the grooves 80a and 80b are constant in a YZ-cross-section regardless of the positions thereof in the X-direction.

The flat-cross-sections of the respective grooves 80c and the respective grooves 80d are formed to an isosceles-triangular-shape which is symmetrical with the grooves 80a and the grooves 80b. The cross-sectional-area of them are constant in a YZ-cross-section regardless of the positions thereof in the X-direction (refer to FIG. 2).

As shown in FIG. 3, one ends, which have male screws formed on the outer peripheries thereof, of refrigerant supply joints 86A and 86B are attached to the screw holes 78a and 78b, respectively and the other ends of the refrigerant supply joints 86A and 86B are connected to a refrigerant supply device 102 to be described later, respectively through refrigerant supply pipes 88A and 88B as shown in FIG. 2 (refer to FIG. 5). Note that, actually, the refrigerant supply pipes 88A and 88B are composed of main pipes, one ends of which are connected to the refrigerant supply device 102, and branch pipes connected to the other end of the main pipes through distributor 89A and 89B (refer to FIG. 2). Further, as shown in FIG. 3, one ends, which have male screws formed on the outer peripheries thereof, of refrigerant discharge joints 90A and 90B are attached to the respective screw holes 78c and 78d and the other ends of the refrigerant discharge joints 90A and 90B are connected to the refrigerant supply device 102 through refrigerant discharge pipes 92A and 92B, respectively as shown in FIG. 2 (refer to FIG. 5). Note that, actually, the refrigerant supply pipes 88A and 88B are also composed of main pipes, one ends of which are connected to the refrigerant supply device 102, and branches pipe connected to the other end of the main pipes through distributors.

FIG. 5 shows the arrangement of the cooling system of the base 32 in a simplified fashion. The cooling system of FIG. 5 is mainly composed of the refrigerant supply device 102 as a fluid supply device including a refrigerant supply unit 104, a refrigerator 106 and a controller 108 composed of a microcomputer for controlling them.

The refrigerant supply unit 104 has two fluid accommodating chambers (refrigerant accommodating chambers) disposed therein capable of accommodating the first fluid and a second fluid, respectively. An end of the first fluid passage 62 in the base 32 and an end of the second fluid passage 64 therein are connected to the discharge ports of the fluid accommodating chambers, respectively through the refrigerant supply pipes 88A and 88B. The refrigerant supply unit 104 individually regulates predetermined physical values, for example, a flow rate (or a discharge pressure corresponding to the flow rate) relating to the Reynolds number Re of the first fluid and the second fluid to be discharged based on an instruction from the controller 108 as well as discharges the first fluid and the second fluid whose flow rates having been regulated into the refrigerant supply pipes 88A and 88B, respectively.

The refrigerator 106 has two fluid accommodating chambers (refrigerant accommodating chambers) disposed therein which can accommodate the first fluid and the second fluid and are connected to the respective fluid accommodating chambers in the refrigerant supply unit 104 through piping systems. The other end of the first fluid passage 62 in the base 32 and the other end of the second fluid passage 64 therein are connected to the respective fluid accommodating chambers in the refrigerator 106 on the side thereof opposite to the refrigerant supply unit 104 through the refrigerant discharge pipes 92A and 92B, respectively. The refrigerant supply unit 104 cools the temperatures of the first and second fluids to temperatures lower than the atmospheric temperature of the base 32 in response to an instruction from the controller 108 and supplies them to the refrigerant supply unit 104. That is, in the embodiment, a temperature controller for controlling the temperatures of the first and second fluids to temperatures lower than the atmospheric temperature of the base 32 is composed of the controller 108 and the refrigerator 106.

In the embodiment, Fluorinert (manufacturer: Sumitomo 3M Co. Ltd., fluorine inert liquid), for example, is used as the first fluid and water, for example, is used as the second fluid, respectively.

The controller 108 previously stores information such as the shapes (including sizes) and the surface states of the first and second fluid passages 62 and 64 and the kinematic viscosity coefficients and the like of the first and second fluids in a memory, calculates the Reynolds numbers Re of the flow of the Fluorinert in the first fluid passage 62 and the flow of the water in the second fluid passage 64, respectively based on the information, and supplies instruction values to the refrigerant supply unit 104 to provide flow rates (or discharge pressures) at which the flow of the Fluorinert is made to a laminar flow and the flow of the water is made to a transition flow (2000<Re<3000). In addition, The controller 108 supplies an instruction value to the refrigerator 106 based on a result detected by a not shown temperature sensor to set the temperatures of the water and the Fluorinert lower than the atmospheric temperature of the base 32.

Note that, although not particularly explained in the above description, it is needless to say that sealing is suitably applied to the portions where the film 60 is in contact with the columns 68, the portions where the spacers 70 are in contact with the stator yoke 58, the portions where the spacers 70 are in contact with the bottom wall of the vessel 56 and the portions where the first and second fluid passages 62 and 64 are jointed to the other members to prevent the leakage of the fluids in the first and second fluid passages 62 and 64 to the outside.

When the above base 32 is assembled, first, as shown in FIG. 4, the upper structural member (that is, the structural member made by integrally assembling the upper member 56A of the vessel 56 (in which the film 60 and the columns 68 have been assembled) and the upper mounting members 54A$_1$ and 54B$_1$) is assembled to the lower structural member of the base 32 supported by the floor surface FLOOR SURFACE FD through the plurality of support columns 72 (that is, the structural member made by integrally assembling the lower member 56B of the vessel 56 (in which the stator yoke 58 and the armature coils 34 have been assembled) and the lower mounting members 54A$_2$ and 54B$_2$) from an upper side. When they are assembled, the respective columns 68 are successively inserted into a series of the round holes having circular cross-sections which confront the columns 68, are composed of the hollow portions of the confronting armature coils 34, the above circular openings 58a and the spacers 70 and the circular openings 58c, and extend in an up and down direction the predetermined length. The lower ends of the columns 68 are exposed to the outside from the bottom surface of the lower member 56B through the round holes.

Next, the fixing member 74 is lifted up to a position where it is abutted against the bottom surface of the lower member 56B shown by the imaginary line in FIG. 4. In this state, the respective bolts 76 are screwed into the nuts 66 through the stepped circular openings 74a of the fixing member 74 and the hollow portions of the respective columns 68. Then, the lower structural member of the base 32 is integrally assembled to the upper structural member thereof by suitably tightening the bolts 76. Note that although omitted in the figure, a buffer member is interposed between the lower member 56B of the vessel 56 and the upper member 56A thereof.

Finally, the base 32 shown in FIG. 3 and FIG. 1 is completed by connecting the refrigerant supply joints 86A and 86B and the refrigerant discharge joints 90A and 90B to the screw holes 78a, 78b, 78c and 78d, respectively.

In this case, as will be appreciated from FIG. 3, the upper structural member of the base 32 is not strongly jointed to the lower structural member thereof mechanically and is only apparently integrated therewith through the bolts 76. That is, the contacts portions of the upper structural member and the lower structural member are in contact with each other only through the portions where the not shown buffer is interposed. Therefore, when the wafer stage WST is driven, the reaction force generated to the respective armature coils 34 in the lower structural member is transmitted to the floor surface FD through the support columns 72 so that the reaction force does not directly act as the oscillating factor of the upper structural member. That is, in the embodiment, the holding member for holding the armature coils 34 (and the stator) is arranged by being isolated from the upper member 56A as the first member, on which the moving surface 32a is disposed, by the lower member 56B of the vessel 56 and the support columns 72 with reference to oscillation.

In this case, since the upper member 56A, on which the moving surface 32a formed, is secured to the fixing member 74, which is fixed to the main body column 12, through the bolts 76 and the projecting optical system PL is held by the main body column 12, the relative positional relationship between the moving surface 32a and the projecting optical system PL is maintained in a constant relationship. Therefore, the position of the substrate table 36 (wafer stage WST) can be measured with the wafer interferometer 46 fixed on the upper surface of the base 32 with pinpoint accuracy. Further, the reaction force generated to the above respective armature coils 34 does not acts as the oscillating factor of the projecting optical system PL held by the main body column 12.

Here, the action of the cooling system of the base arranged as described above will be briefly described. The Fluorinert is supplied from the refrigerant supply device 102 into the joint mounting member 54A through the refrigerant supply joint 86A after it is cooled to a temperature lower than the atmospheric temperature of the base 32, restricted when it passes through the plurality of grooves 80a in the joint mounting member 54A, respectively, and flows together at the exits of the grooves 80a so that it is made to a film-like water flow having a width whose size is approximately the same as that of the base main body 52 in the Y-direction. Then, the Fluorinert flows into the first fluid passage 62 from one side in the X-direction through the through hole 82a, flows to the other side in the X-direction in the first fluid passage 62 at an approximately constant speed and returns to the refrigerant supply device 102 through the through hole 82c and the plurality of grooves 80c and through the refrigerant discharge joint 90A and the refrigerant discharge pipe 92A. In this manner, the Fluorinert as the first fluid is supplied into the base again after it is cooled so that it is used through circulation.

In this case, as described above, since the flow rate of the Fluorinert is regulated by the controller 108 in the refrigerant supply device 102, the flow of the Fluorinert in the first fluid passage 62, specifically, the flow of the Fluorinert flowing along the film 60 is made to a laminar flow (equal to or less than the critical Reynolds number) so that a temperature boundary layer can be formed in the flow. Thus, the flow between the film 60 and the ceiling wall 57 of the vessel 56 is made to a flow in which a boundary exists between a high temperature zone and a low temperature zone as shown in FIG. 7. As a result, the Fluorinert is discharged into the refrigerant discharge pipe 92A through the refrigerant discharge joint 90A before the heat of the armature coils 34 reaches the ceiling wall 57 of the vessel 56, whereby the transmission of the heat of the armature coils 34 to the moving surface 32a side can be substantially reliably prevented. That is, in the embodiment, the space for forming the first fluid passage 62, in which the first fluid flows, acts as a heat insulating chamber.

Further, in this case, since the Fluorinert in the first fluid passage 62 flows around the projections 56a disposed in the base main body 52 in a two-dimensional direction at predetermined intervals, there is a possibility that the flow of the Fluorinert is disturbed by the existence of the projections 56a. To prevent the occurrence of such a circumstance before it happens, in the embodiment, the outside shape of the projections 56a, which constitute the deformation preventing member together with the columns 68, is made to the laminar flow wing shape which slenderly extends in the X-axis direction as described above.

The water is supplied from the refrigerant supply device 102 into the joint mounting member 54A through the refrigerant supply joint 86B after it is cooled to a temperature lower than the atmospheric temperature of the base 32, restricted when it passes through the plurality of grooves 80b in the joint mounting member 54A, respectively, and flows together at the exits of the grooves 80b so that it is made to a film-like water flow having a width whose size is approximately the same as that of the base main body 52 in the Y-direction. Then, the water flows into the second fluid passage 64 from one side in the X-direction through the through hole 82b, flows to the other side in the X-direction in the second fluid passage 64 at an approximately constant speed and returns to the refrigerant supply device 102 through the through hole 82d and the plurality of grooves 80d and through the refrigerant discharge joint 90B and the refrigerant discharge pipe 92B. In this manner, the water as the second fluid is supplied into the base 32 again after it is cooled so that it is used through circulation.

In this case, as described above, since the flow rate of the water is regulated by the controller 108 in the refrigerant supply device 102, the flow of the water in the second fluid passage 64 (particularly, the flow of the water along the lower surface of the stator yoke 58) is made to a flow whose Reynolds number Re is near to that of a transition flow (2000<Re<3000). Accordingly, heat exchange is effectively carried out between the stator yoke 58 and the water as compared with the case in which the flow in the second fluid passage 64 is a laminar flow, whereby the heat of the respective armature coils 34 is promptly and effectively removed (cooled). That is, in the embodiment, the space for forming the second fluid passage 62, in which the second fluid flows, acts as a cooling chamber.

A heat transfer coefficient between solid and liquid greatly depends on Reynolds number of the flow in a flow passage. For example, when the flow in a flow passage is a turbulent flow, its Reynolds number is ten to several tens of times as large as that of a laminar flow and the Reynolds number of a transition flow takes a middle value between them. It is preferable that the boundary layer on the lower surface of the stator yoke 58 is a turbulent flow in the meaning of removing the heat generated by the respective armature coils 34.

However, since there is a possibility that the base main body 52 is oscillated by the turbulent flow in the above arrangement, the boundary layer is made to the transition flow.

It is preferable here to make the surface of the film 60 smooth and to make the wall surface (lower surface) of the stator yoke 58 on the second fluid passage 64 side of the stator yoke 58 more coarse than the film surface. This is because that with this arrangement the boundary layer of the flow of the Fluorinert flowing along the film 60 is liable to be made to a laminar flow, whereas the flow of the water flowing along the lower surface of the stator yoke 58 is liable to be made to a moderately disturbed transition flow. Further, when the surface states of the film 60 and the second fluid passage 64 are set as described above, it is possible to make the flow of the fluid in the first fluid passage 62 to a laminar flow and to make the flow in the second fluid passage 64 to a transition flow even if the refrigerant supply device does not have a function for regulating the flow speed (or discharge pressure) of a discharged fluid different from the embodiment.

Further, in the embodiment, as shown in FIG. 5, since the flows LF1 and LF2 of the first and second fluids in the first and second fluid passages 62 and 64 are directed to the same direction, that is, directed from one side in the X-direction to the other side, the entire base 32 can be uniformly cooled.

Note that, contrary to the above arrangement, the refrigerant supply joint 86B connected to the refrigerant supply pipe 88B may be connected to the screw hole 78d, whereas the refrigerant discharge joint 90B connected to the refrigerant discharge pipe 92B may be connected to the screw hole 78b. With this arrangement, the Fluorinert flows from one side in the X-direction to the other side in the first fluid passage 62, whereas the water flows from the other side in the X-direction to the one side in the second fluid passage 64. That is, since the flows in the first and second flow passages 62 and 64 are directed to an opposite direction each other, the temperature of the entire base 32 can be lowered. Note that Fluorinert may be flown in the second fluid passage 64 in place of water. In this case, it is preferable to set the temperature of the Fluorinert flowing in the second fluid passage 64 lower than that of the Fluorinert flowing in the first fluid passage 62.

Further, although omitted in FIG. 1, the exposure device 100 includes an obliquely-incident type multi-focal-point positions detecting system AF as a focus level sensor which is similar to that disclosed in Japanese Unexamined Patent Publication No. 5-190423 and the like (refer to FIG. 6). The multi-focal-point positions detecting system AF is composed of an irradiating optical system and a light receiving optical system. The irradiating optical system supplies imaging luminous flux to the best imaging surface of the projecting optical system PL to form a plurality of slit images from an oblique direction with respect to the optical axis AX direction. The light receiving optical system receives the respective reflected luminous fluxes of the imaging luminous flux reflected on the surface of a wafer W, respectively through slits. The controller 50 drives and controls the substrate table 36 in the Z-direction and an inclined direction through the support mechanisms 38a–38c based on the positional variations of the surface of the water W in the Z-direction with respect to an imaging surface at a plurality of points thereof detected by the multi-focal-point positions detecting system AF so that a predetermined gap can be maintained between the wafer W and the projecting optical system PL.

FIG. 6 schematically shows the arrangement of the stage control system of the exposure device 100. The stage control system of FIG. 6 is mainly composed of the controller 50 which is mainly composed of a microcomputer. The reticle interferometer 16, the wafer interferometer 46 (46X and 46Y), the multi-focal-point positions detecting system AF and the like are connected to the input side of the controller 50. Further, the support mechanisms 38a–38c, a current drive circuit 71, the reticle drive unit 15 and the like are connected to the output side of the controller 50. The above n×n armature coils 34 are connected to the current drive circuit 71.

Next, the flow of the exposing operation in the exposure device 100 arranged as described above will be briefly described.

First, the reticle and the wafer are loaded by a reticle loader and a wafer loader, which are not shown, under the management of a not shown main controller. Further, a preparatory job such as reticle alignment, base line measurement and the like is carried out using a not shown reticle microscope, a not shown reference mark sheet on the substrate table 36 and a not shown alignment detecting system in a predetermined procedure.

Thereafter, the main controller executes alignment measurement such as EGA (enhancement global alignment) and the like using a not shown detecting system. In this operation, when it is necessary to move the wafer W, the controller 50 moves the substrate table 36 (wafer stage WST), on which the wafer W is held, in a desired direction in response to an instruction from the main controller by controlling at least one of the current value and the current direction of the current supplied to the armature coils 34 which confront the thrust force generating magnets constituting the pole unit 40 through the current drive circuit 71. After the alignment measurement is finished, a step-and-scan type exposing operation will be carried out as described below.

In the exposing operation, first, the wafer stage WST is moved so that the XY-position of the wafer W is set at a scanning start position for exposing a first shot region (first shot) on the wafer W. At the same time, the reticle stage RST is moved so that the XY-position of the reticle R is set at the scanning start position. Then, scanning and exposure is carried out in such a manner that the controller 50 moves the reticle R and the wafer W in synchronism with each other through the reticle drive unit 15 and the substrate stage unit 30 in response to an instruction from the controller 50 based on the XY-position information of the reticle R measured with the reticle interferometer 16 and the XY-position information of the wafer W measured with the wafer interferometer 46. The movement of the wafer W is carried out by the controller 50 which controls at least one of the current value and the current direction of the current supplied to the armature coils 34 which confront the thrust force generating magnets constituting the pole unit 40 through the current drive circuit 71.

When the transfer of a reticle pattern onto the one shot region is finished as described above, the wafer stage WST is stepped by the one shot region and scanning and exposure is carried out to the next shot region. The stepping and the scanning/exposure are sequentially repeated as described above, whereby patterns of a necessary number of shots are transferred onto the wafer W.

Since a current is appropriately supplied to the respective armature coils 34 constituting the stator of the flat motor device at the time of the above alignment and scanning/exposure, the armature coils 34 generate heat. However, the transmission of the heat to the moving surface 32a is effectively suppressed (or prevented) as described below.

That is, the refrigerant supply device 102 supplies the first fluid (Fluorinert) in the first fluid passage 62 in the base 32 and the second fluid (water) in the second fluid passage 64 into the respective fluid passages in the state that the flowing state of the respective flows (flow rates here) are regulated so that the flow conditions of the first fluid is different from that of the second fluid, more specifically, so that the flow LF1 (refer to FIG. 5) of the first fluid in the first fluid passage 62 is made to a laminar flow and the flow LF2 (refer to FIG. 5) of the second fluid in the second fluid passage 64 is made to a transition flow near to a turbulent flow. As a result, the temperature boundary layer is formed in the flow of the first fluid in the first fluid passage 62, whereby the transmission of the heat to the moving surface 32a can be effectively prevented. Further, the heat transfer coefficient between solid and liquid, that is, between the second fluid in the second fluid passage 64 and the stator yoke 58 constituting the wall on the armature coils 34 side is increased as well as the stator yoke 58 with which the armature coils 34 come into contact is formed of a magnetic material having a high heat transfer coefficient. Accordingly, the stator yoke 58 not only functions as a magnetic circuit constituting member but also effectively transits the heat generated by the armature coils 34 to the surface opposite to the moving surface 32a. As a result, heat exchange is effectively executed between the stator yoke 58 and the second fluid, whereby heat removal (cooling) is effectively carried out to the armature coils 34, and the temperature increase itself of the respective armature coils 34 can be suppressed thereby.

The refrigerant supply device 102 supplies the first and second fluids into the first and second fluid passage 62 and 64 in the base 32 in the state that the temperatures thereof are controlled lower than the temperature of the atmosphere of the base 32. Thus, heat exchange is also carried out between the film 60 and the first fluid, in addition to, needless to say, between the stator yoke 58 and the second fluid, whereby the armature coils 34 can be effectively cooled from both the upper and lower surfaces thereof. However, since the temperature boundary layer exists in the flow of the first fluid, the heat of the armature coils 34 is not almost transmitted up to the moving surface 32a through the above heat exchange.

Further, in the embodiment, the first and second fluid passages 62 and 64 (including the grooves 80a–80d portions), which have approximately the same cross-sectional areas, are disposed in the base 32 to discharge the first and second fluids, which are supplied from one side in the X-direction through the refrigerant supply joints 86A and 86B, through the refrigerant discharge joints 90A and 90B located on the other side in the X-direction. Thus, the first and second fluids having flown into the base 32 through the refrigerant supply joints 86A and 86B spread like a film and is uniformly supplied to the armature coils 34 on the upper and lower sides thereof, whereby the heat of the plurality of armature coils 34 which are disposed a the plane is uniformly removed.

The transmission of the heat discharged from the entire surfaces of the armature coils 34 to the moving surface 32a side can be effectively suppressed by the above arrangement and thus the thermal effect on the peripheral environment can be suppressed as much as possible. Further, in the embodiment, since the first and second fluids, which are supplied from the refrigerant supply device 102 into the base 32 through the refrigerant supply pipes 88A and 88B and the refrigerant supply joints 86A and 86B, are used through circulation, the armature coils 34 can be economically cooled using the fluids in substantially constant amounts at all times.

As described above, according to the embodiment, since the thermal effect on the environment of the device can be suppressed to a minimum level, almost no problem is caused by the fluctuations in air of the interferometer beam of the wafer interferometer 46 for measuring the position of the substrate table 36, and the like, so that the position of the wafer can be precisely determined and controlled.

In addition to the above, the stator including the armature coils 34 and the stator yoke 58 is held by the lower member 56B of the vessel 56 and the support columns 72 as the holding member in the state that it is isolated from the upper member 56A of the vessel 56 as the first member on which the moving surface 32a is disposed with reference to oscillation. Accordingly, even if the wafer stage WST including the slider (the pole unit 40 and the air slider 42) of the flat motor device is driven and its reaction force acts on the armature coils 34, the reaction force is not transmitted to the upper member 56A of the vessel 56 as the first member through the armature coils 34. Therefore, the oscillation of the upper member 56A (that is, the moving surface 32a) caused by the drive of the wafer stage WST can be prevented. Accordingly, the oscillation of the fixing member 74 to which the upper member 56A is secured through the bolts 76 and thus the oscillation of the main body column 12 to which the fixing member 74 is secured can be prevented, and thus the oscillation of the projecting optical system PL, and wafer interferometer 46, and the like which is caused by the reaction force resulting from the drive of the wafer stage WST can be prevented thereby.

Therefore, according to the exposure device 100 of the embodiment, the position of the wafer W can be precisely controlled at a high speed by the substrate stage unit 30 provided with the electromagnetic-force-drive type flat motor device as well as exposure can be carried out with high exposure accuracy while enhancing a throughput.

Note that, in the above embodiment, the flat motor device disposed on the substrate stage unit 30 side and its cooling system may be applied to the reticle stage RTS side.

Note that the arrangement and the like of the pole unit 40, the air slider 42, the base 32 and its cooling system as the components of the flat motor device described in the above embodiment are an example and the present invention is not limited thereto. That is, for example, the number of the magnets constituting the pole unit may be 1, 2, 3 or 5 or more. Further, the air slider may be arranged by directly mounting a plurality of air pads on a magnet mounting member constituting a pole unit without providing an air slider.

Further, the fluid passages for flowing fluids need not be necessarily formed in the interiors of the heat insulating chamber and the cooling chamber. That is, the arrangement of the heat insulating chamber is variously contemplated such that, for example, a heat insulating material may be disposed in the heat insulting chamber or the heat insulating chamber may be evacuated. In addition, the arrangement of the cooling chamber is also variously contemplated such that the interior thereof is cooled with a Peltier element or a heat pipe. Even in these cases, when the wafer stage WST is driven, the transmission of the heat generated by the armature coils to the moving surface is suppressed or prevented by the heat insulting chamber, and the armature coils are cooled with the cooling chamber. Therefore, the armature coils can be cooled as well as the effect of the heat, which is generated by the armature coils and transmitted to the moving surface side, on the peripheral environment of the base can be suppressed.

The above embodiment describes the case in which the lower structural member of the base 32 (that is, the structural member made by integrally assembling the lower member 56B of the vessel 56 (in which the stator composed of the stator yoke 58 and the armature coils 34 has been assembled) and the lower mounting member 54A$_2$ and 54B$_2$) is isolated from the upper structural member of the base 32 including the upper member 56A (in which the film 60 and the columns 68 have been assembled) as the first member on which the moving surface 32a is formed with respect to oscillation and supported by the support columns 72 implanted in the floor surface. However, the present invention is not limited thereto. That is, as shown in FIG. 8, the lower structural member of the base 32 (that is, the structural member made by integrally assembling the lower member 56B of the vessel 56 (in which the stator composed of the stator yoke 58 and the armature coils 34 has been assembled) and the lower mounting members 54A$_2$ and 54B$_2$) may be supported by a pair of reaction frames 202A and 202B as a holding member implanted in the floor surface independently of the upper structural member of the above base 32. Note that, in FIG. 8, the same numerals as used in FIG. 3 are used to denote the same or similar components to avoid repeated description.

Also in the above support structure, even if the wafer stage WST including the moving unit (the pole unit 40 and the air slider 42) of the flat motor device is driven and the reaction force thereof acts on the armature coils 34, the reaction force is only transmitted to the floor surface FD through the reaction frames 202A and 202B and is not transmitted to the upper member 56A of the vessel 56 as the first member through the armature coils 34. Therefore, the oscillation of the upper member 56A (that is, the moving surface 32a) due to the drive of the wafer stage WST can be prevented. Accordingly, the oscillation of the fixing member 74, to which the upper member 56A is secured through the bolts 76 and thus the oscillation of the main body column 12, to which the fixing member 74 is secured, can be prevented. The oscillation of the projecting optical system PL, the wafer interferometer 46 and the like resulting from the reaction force caused by the drive of the wafer stage WST can be prevented thereby.

Further, the cooling system in the above embodiment may be arranged as shown in, for example, FIG. 9. In the cooling system of FIG. 8, the arrangement of a piping system 110 acting as the flowing passage of the second fluid is different from the above embodiment. That is, the cooling system of FIG. 8 can switch the flow LF2 of the second fluid in the directions shown by the arrows of dotted lines in FIG. 9 and in the directions opposite to the above directions in the second fluid passage 64.

In FIG. 9, the piping system 110 includes four ends 110a–110d. The first end 110a is connected to the discharge port of the second fluid of the refrigerant supply unit 104, the second end 110b is connected to an end of the second fluid passage 64 of the base 32, the third end 110c is connected to the other end of the second fluid passage 64, and the fourth end 110d is connected to the refrigerator 106. As shown in FIG. 9, the piping system 110 is provided with four opening/closing valves (electromagnetic valves) 112A–112D whose opening and closing are controlled by the controller 108. In this case, the direction of the flow LF2 of the second fluid is made similar to the direction of the flow LF1 of the first fluid by opening the opening/closing valves 112A and 112B and closing the opening/closing valves 112C and 112D. In contrast, the direction of the flow LF2 of the second fluid is made opposite to the direction of the flow LF1 of the first fluid by closing the opening/closing valves 112A and 112B and opening the opening/closing valves 112C and 112D. That is, in the embodiment of FIG. 8, a setting unit for setting the flow LF1 of the first fluid and the flow LF2 of the second fluid in the same direction or in the opposite direction is realized by the piping system 110, the controller 108 and the four opening/closing valves 112A–112D.

Further, while the case in which liquids are employed as the first and second fluids and used through circulation is described in the above embodiment, the present invention is not limited thereto. That is, the fluids are not limited to the liquids and gases may be used. In addition, when air and the like, for example, are used as the fluids, they need not be necessarily used through circulation.

Note that in the above embodiment, a plurality of wafer stages WST which move along the moving surface 32a of the base may be provided. For example, when two wafer stages are provided, while a wafer on one of the wafer states is exposed, other operations such as the replacement of a wafer, measurement of the wafer prior to exposure (for example, alignment), and the like can be carried out on the other wafer stage at the same time. A throughput can be enhanced thereby.

Note that, as also described in the above embodiment, the exposure device according to the present invention is assembled by electrically, mechanically or optically coupling the respective components constituting the device with each other so that the device can execute the position control of a substrate with pinpoint accuracy at a high speed to thereby expose the substrate with pinpoint exposure accuracy while enhancing a throughput.

The case, in which the flat motor device according to the present invention is applied to the substrate stage unit of the scanning type DUV exposure device, has been described in the above embodiment. However, the present invention is not limited thereto and the flat motor device can be also suitably applied not only to a stationary type exposure device such as a stepper and the like but also to an charged particle beam exposure device such as an electron beam exposure device and the like, an exposure device of a so-called EUVL and the like using light in a soft X-ray region having a wavelength of about 5–15 nm as exposure light, devices other than the exposure devices, for example, an inspection device, a substrate transportation device and the like.

ADVANTAGES

As described above, according to the respective inventions described in claims 1 to 9, there is an advantageous effect that a thermal effect on a peripheral environment can be suppressed.

According to the invention described in claim 10, there is an advantageous effect that the oscillation of the first member (moving surface) caused by the drive of the moving element can be prevented.

Further, according to the invention described in claim 11, there is an advantageous effect that exposure can be carried out with pinpoint accuracy while maintaining a high throughput.

REFERENCE NUMERALS

Figure 1:
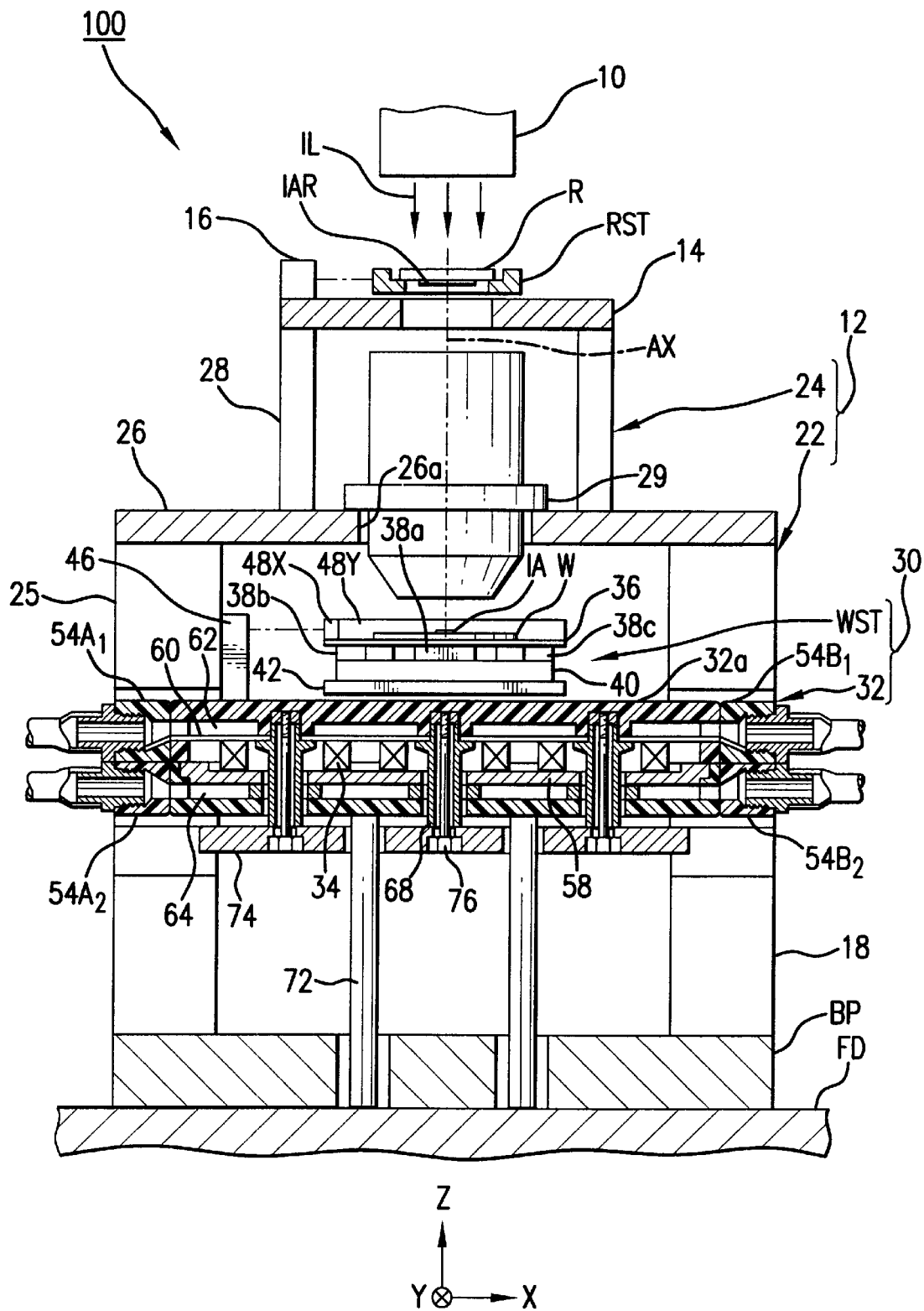
FIG. 1 is a view showing the schematic arrangement of an exposure device according to an embodiment.
Figure 2:
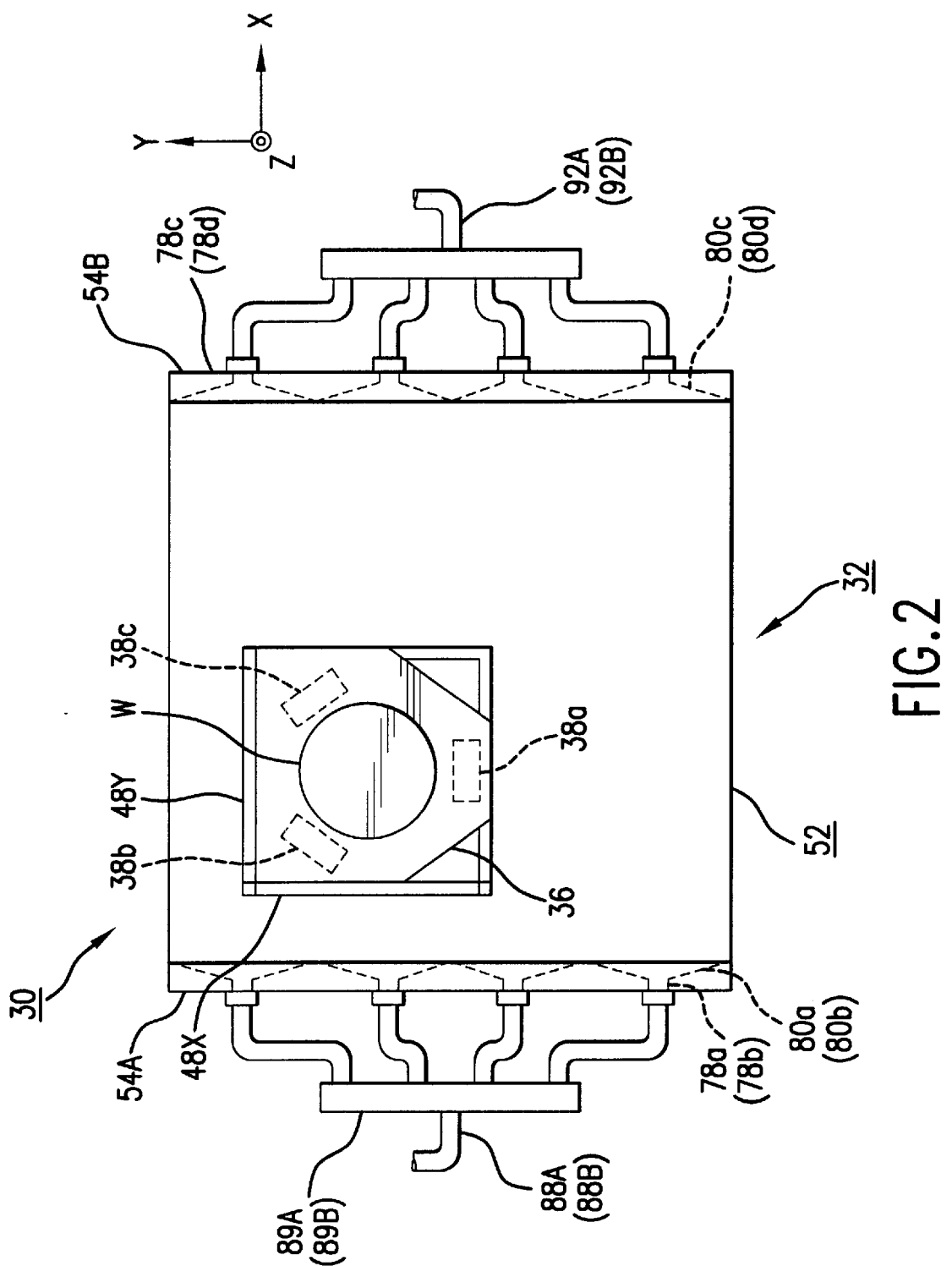
FIG. 2 is a plan view showing a substrate state unit.
Figure 3:
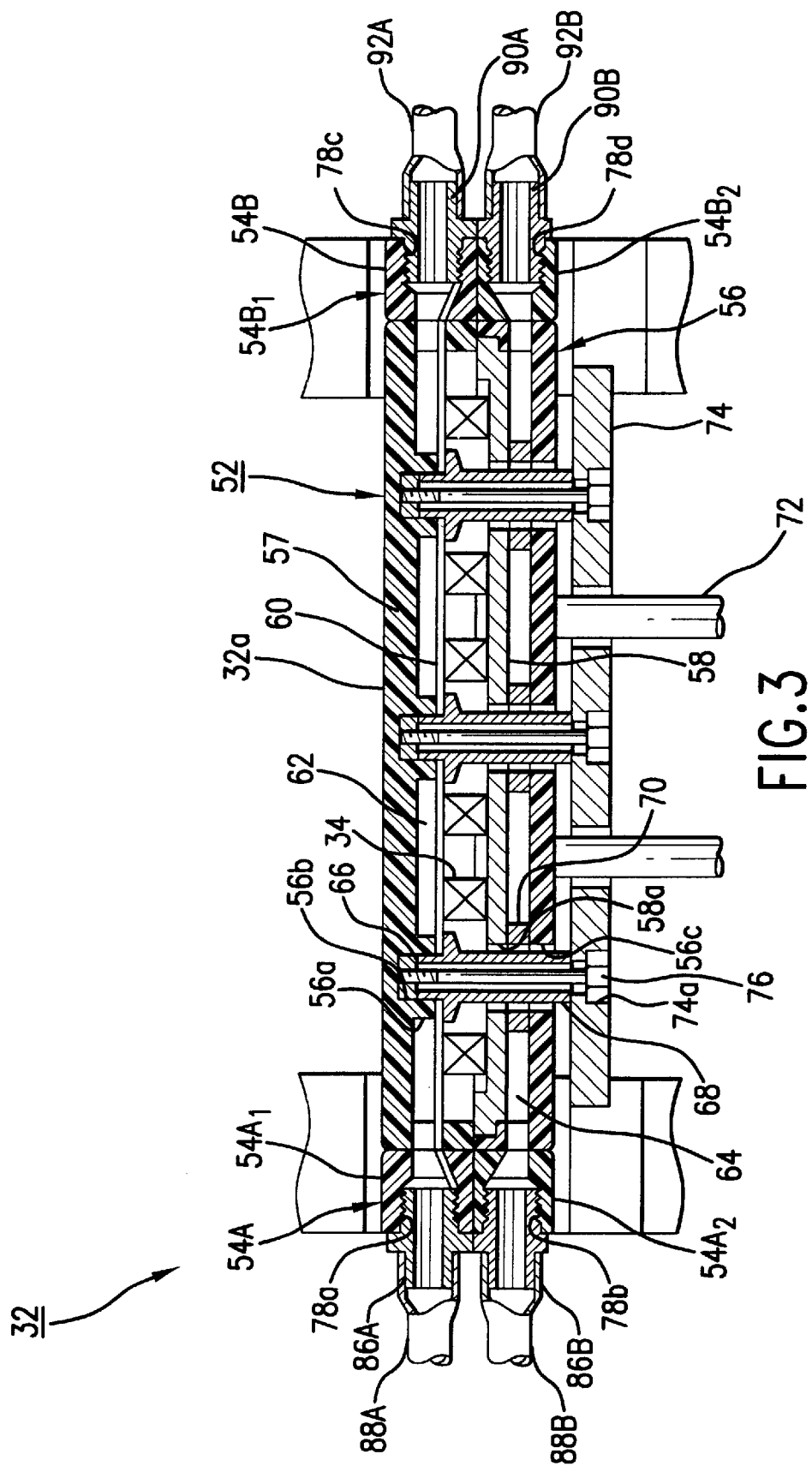
FIG. 3 is an enlarged view showing a base portion in FIG. 1.
Figure 4:
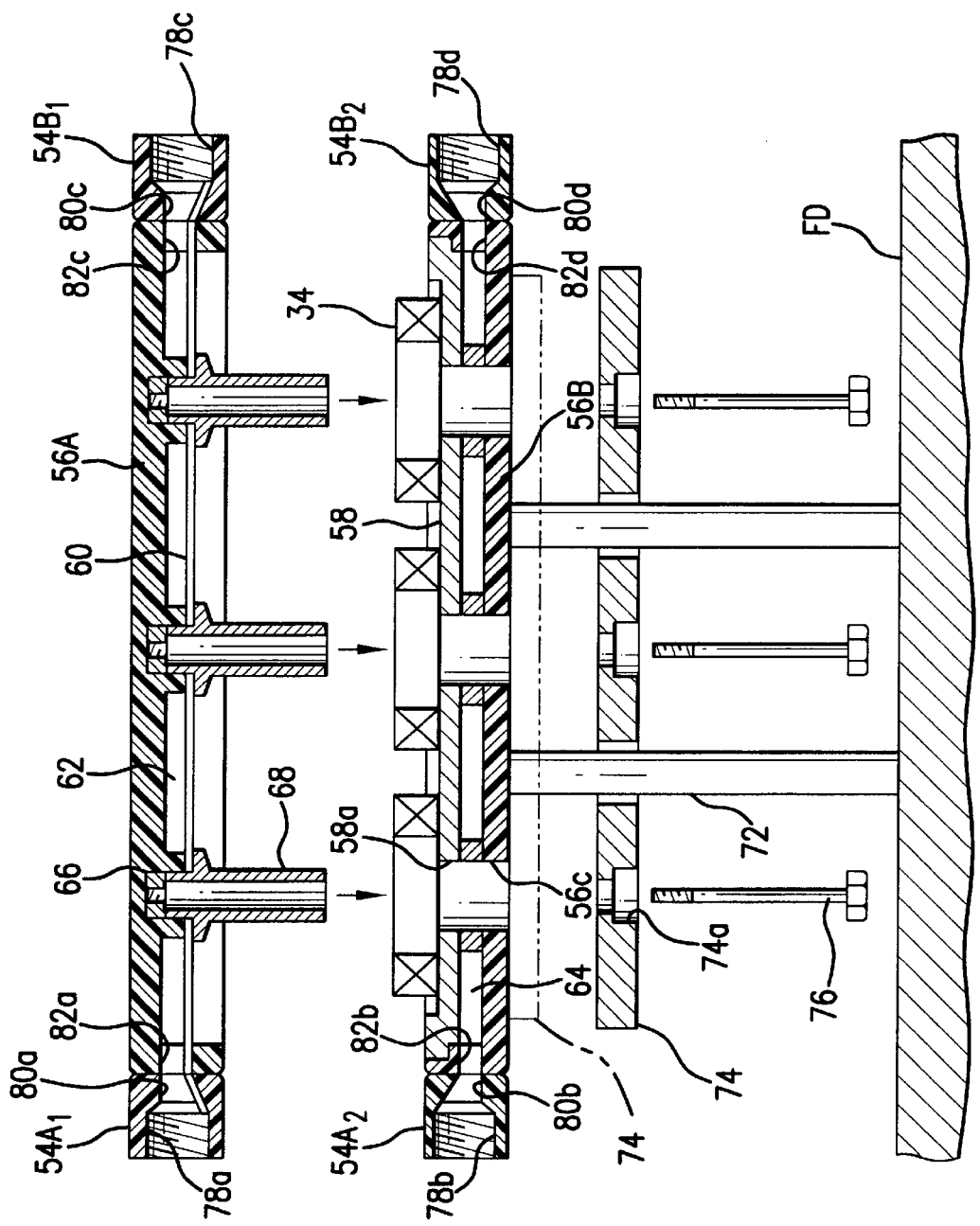
FIG. 4 is a view explaining an assembling procedure of a base in FIG. 1.
Figure 5:
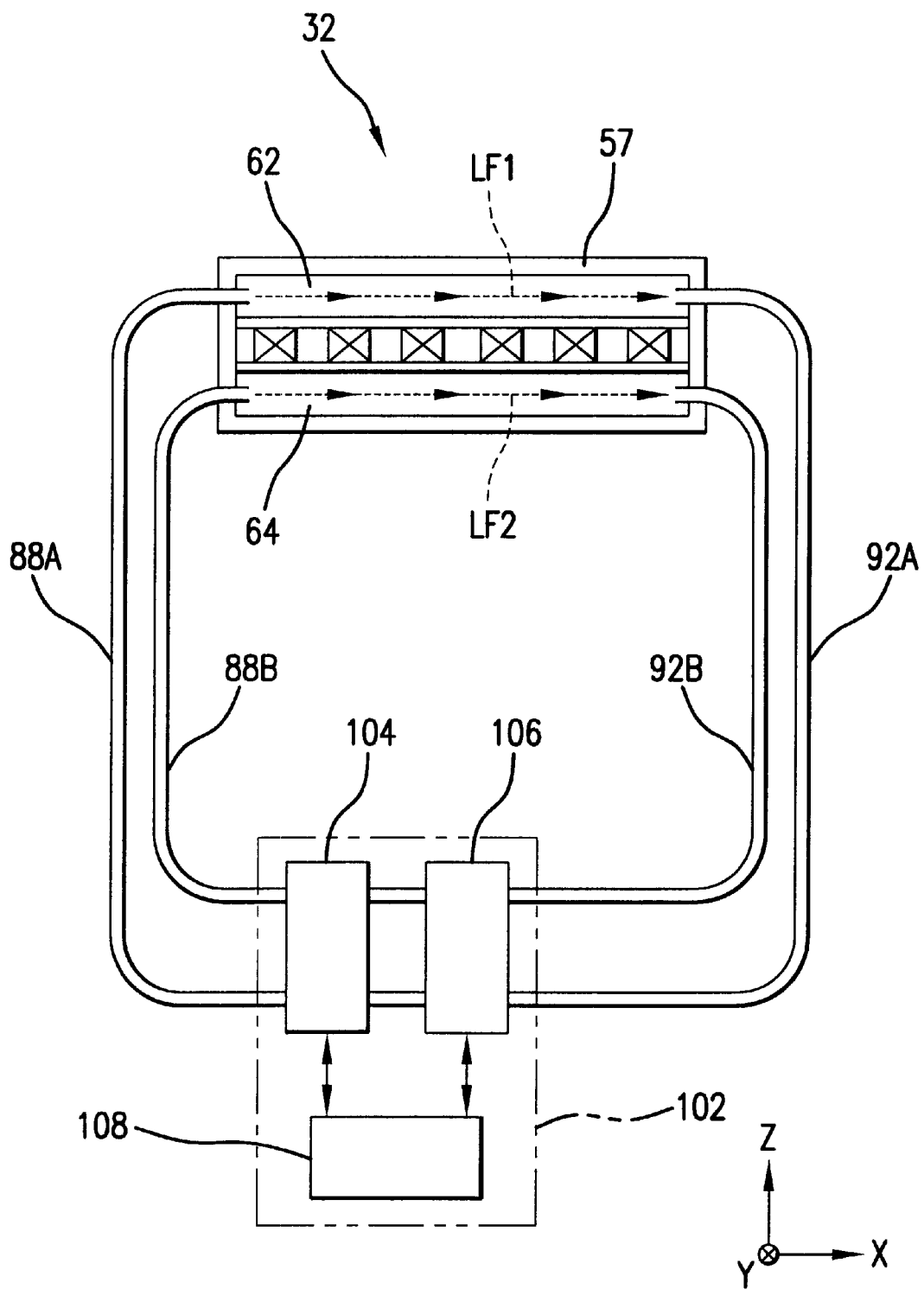
FIG. 5 is a view schematically showing the arrangement of the cooling system of the base constituting the exposure device.
Figure 6:
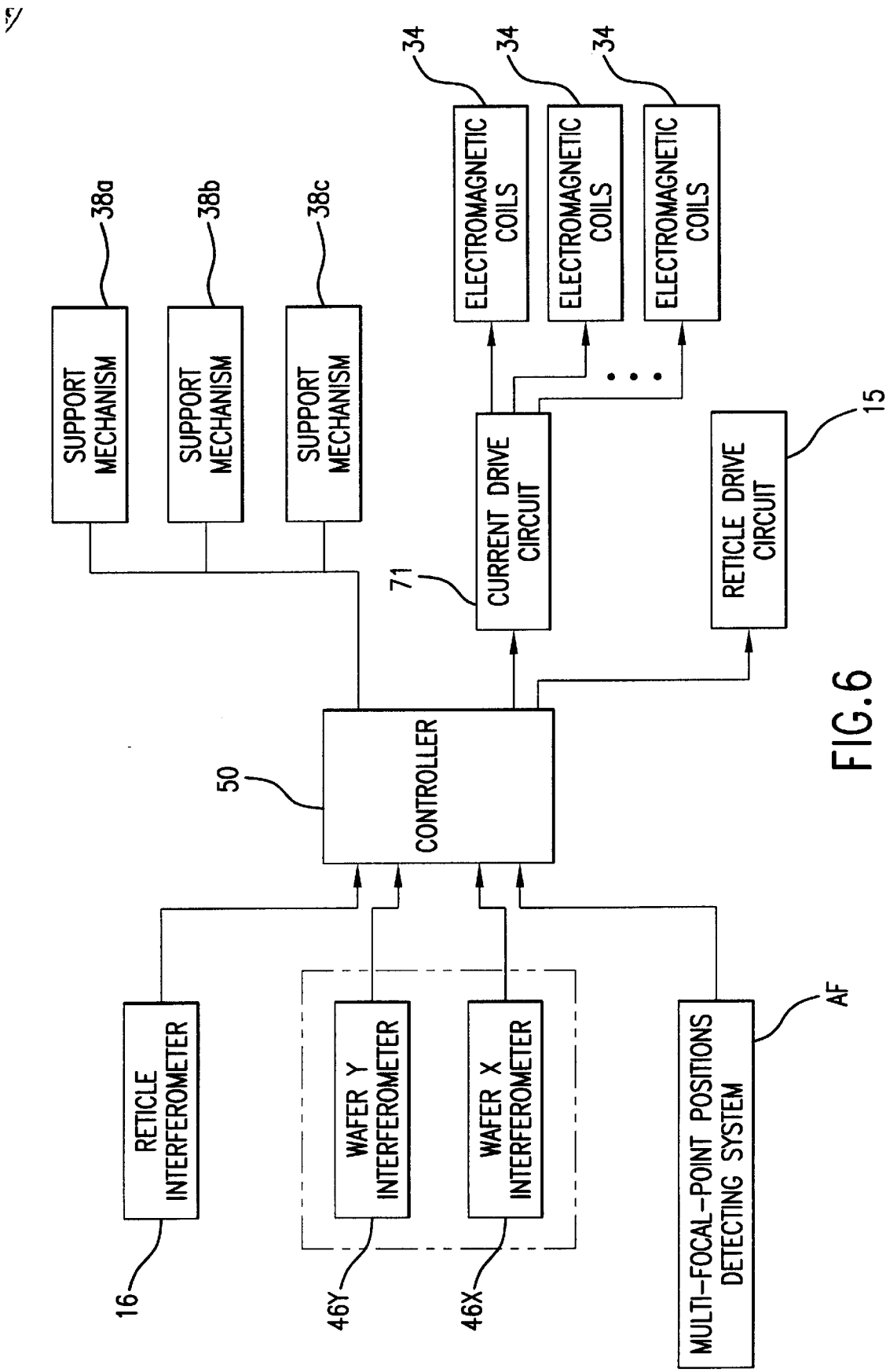
FIG. 6 is a block diagram showing the simplified arrangement of the stage control system of the exposure device in FIG. 1.
Figure 7:
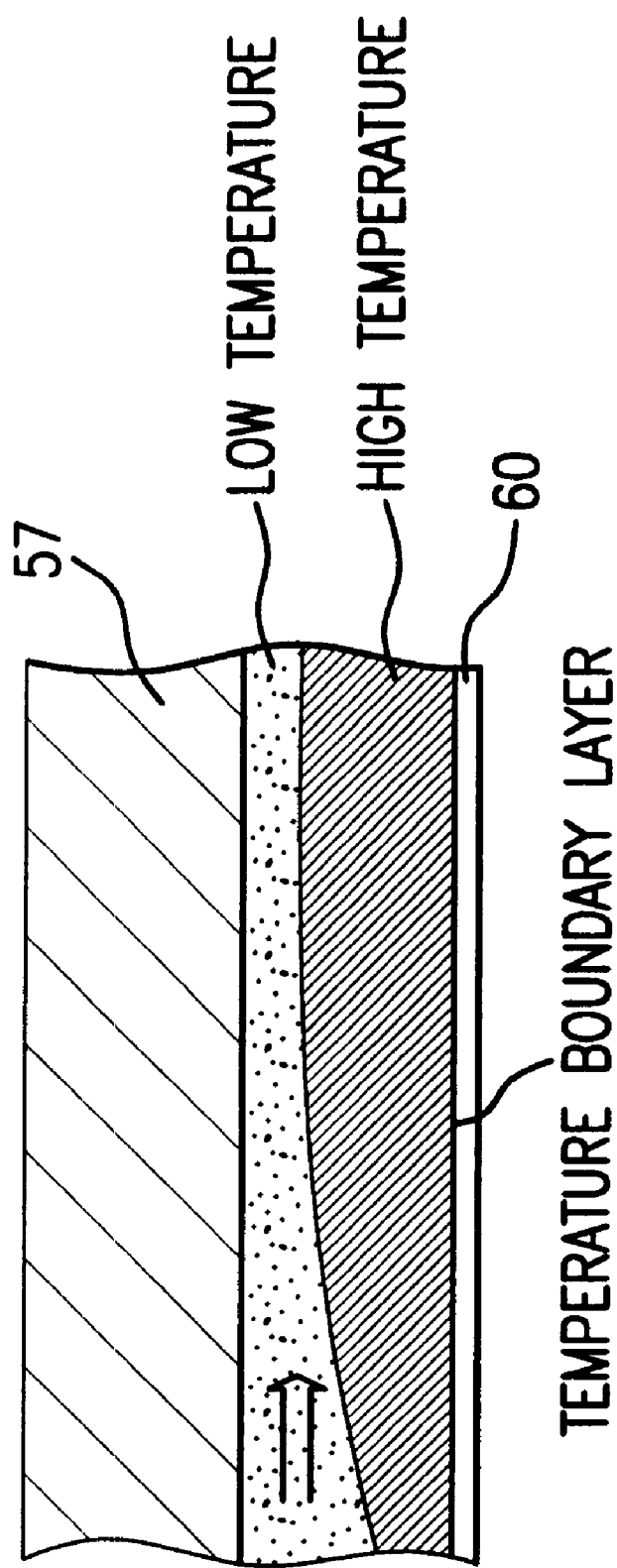
FIG. 7 is a view showing how a fluid flows in a first fluid passage.
Figure 8:
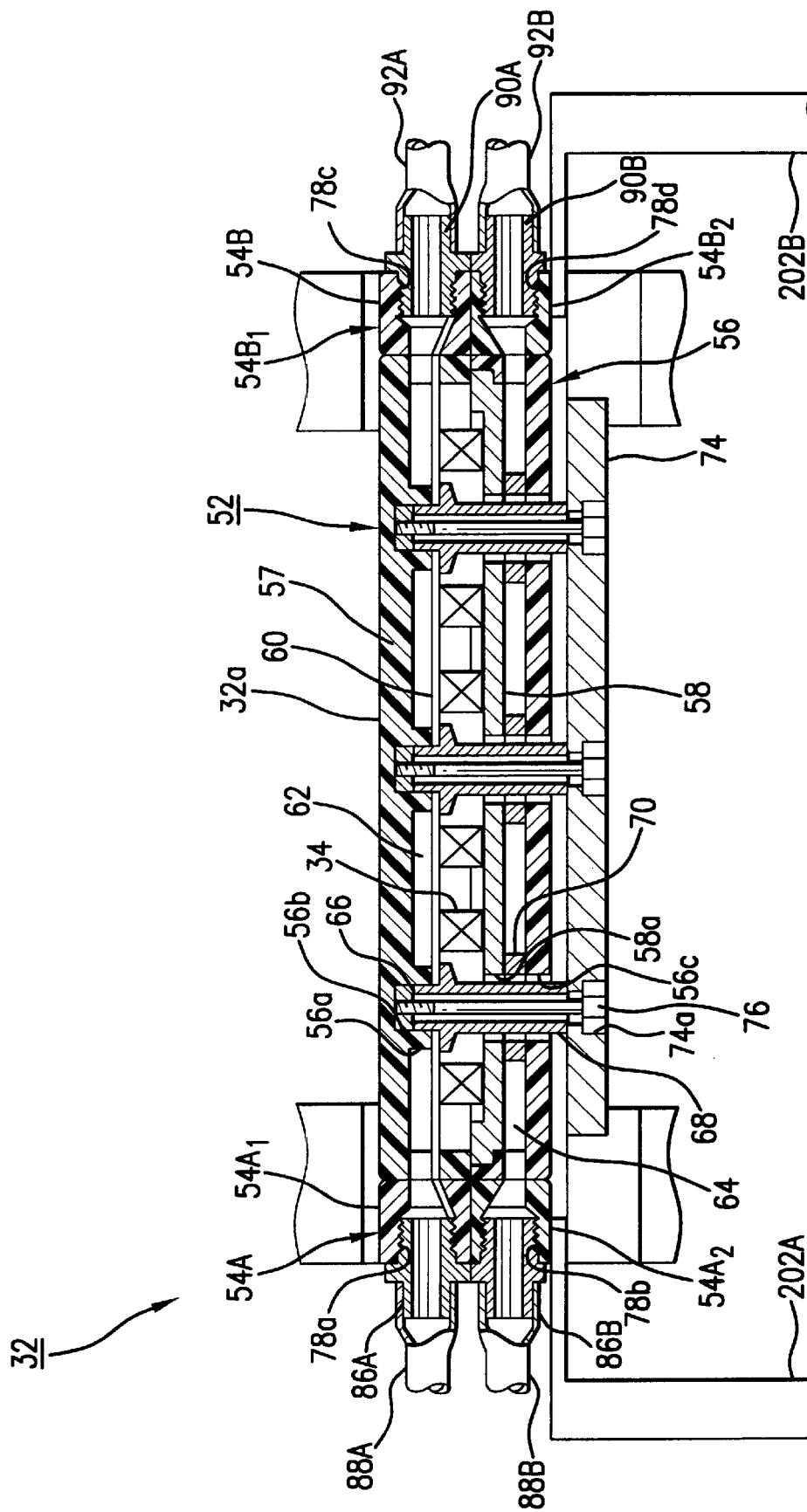
FIG. 8 is a view showing a modification of the support structure of the lower structural member of the base including the stator of a flat motor device.
Figure 9:
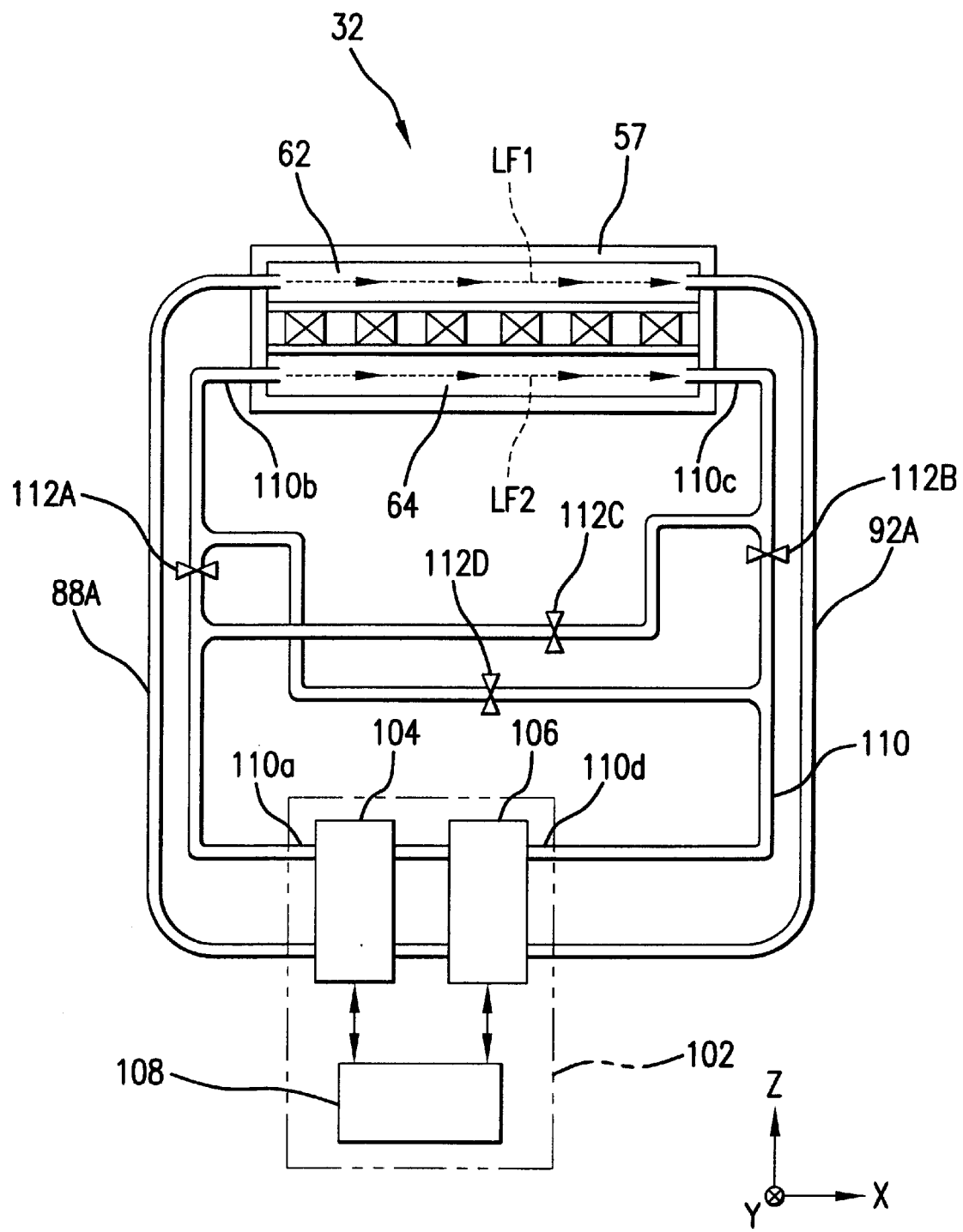
FIG. 9 is a view showing another embodiment of the cooling system of the base.

30 . . . substrate stage unit, 32 . . . base (fixed unit, a potion of flat motor device), 32a . . . moving surface, 34 . . . armature coils (a portion of stator), 40 . . . pole unit (a portion of moving unit, a portion of moving element, a portion of flat motor device), 42 . . . air slider (a portion of moving unit, a portion of moving element, a portion of flat motor device), 56a . . . projection (a portion of deformation preventing member), 56A . . . upper member (first member), 56B . . . lower member (a portion of holding member), 57 . . . ceiling wall (first wall), 58 . . . stator yoke (a portion of stator), 60 . . . film (partition member), 62 . . . first fluid passage (heat insulating chamber), 64 . . . second fluid passage (cooling chamber), 68 . . . column (a portion of deformation preventing member), 72 . . . support column (a portion of holding member), 100 . . . exposure device, 102 . . . refrigerant supply device (fluid supply device), 106 . . . refrigerator (a portion of temperature controller), 108 . . . controller (a portion of temperature controller), W . . . wafer (substrate)

What is claimed is:

1. A flat motor device, comprising:

a moving unit that moves along a predetermined moving surface; and a fixed unit having the moving surface formed on a side thereof confronting the moving unit, wherein one of the moving unit and the fixed unit includes a pole unit; and the other of the moving unit and the fixed unit includes armature coils, a heat insulating chamber disposed adjacent a first side of the armature coils that faces toward the moving surface and a cooling chamber disposed adjacent a second side of the armature coils that faces opposite the first side.

2. A flat motor device according to claim 1, wherein interiors of the heat insulating chamber and the cooling chamber are arranged as first and second fluid passages respectively in which fluids having different flow conditions flow.

3. A flat motor device according to claim 2, further comprising a fluid supply device that supplies first and second fluids into the first and second fluid passages by regulating flow states so that the flow of the fluid in the interior of the heat insulating chamber is made to a laminar flow and the flow of the fluid in the interior of the cooling chamber is made to an approximate transition flow.

4. A flat motor device according to claim 3, wherein the fluid supply device supplies the first and second fluids into the respective first and second fluid passages so that the flowing direction of the fluid flowing in the heat insulating chamber and the flowing direction of the fluid flowing in the cooling chamber are one of a same direction or an opposite direction.

5. A flat motor device according to claim 1, wherein the fixed unit includes a first wall having the moving surface formed on one side thereof and a deformation preventing member for supporting the first wall from the other side thereof.

6. A flat motor device according to claim 5, wherein:

the fixed unit includes, in an interior thereof, the armature coils disposed along the moving surface, the heat insulating chamber disposed on the moving surface side of the armature coils and the cooling chamber disposed the side of the armature coils opposite to the moving surface side; and a cross-sectional shape of the deformation preventing member is a tapered shape in a flow passage portion thereof in the heat insulating chamber.

7. A flat motor device according to claim 6, further comprising a plate-shaped partition member disposed on the moving surface side of the armature coils, and wherein the flow passage in the heat insulating chamber is formed between the first wall and the partition member.

8. A flat motor device according to claim 2, further comprising a temperature controller that controls the temperatures of the respective fluids to temperatures lower than an atmospheric temperature of the flat motor device.

9. A flat motor device according to claim 1, further comprising a holding member isolated from the fixed unit with respect to oscillation for holding the armature coils or the pole unit of the fixed unit.

10. An exposure device for transferring a predetermined pattern onto a substrate, wherein the exposure device includes the flat motor device according to claim 1 in a substrate stage unit for driving the substrate.

11. An exposure apparatus that exposes a pattern onto a substrate, comprising:

a substrate stage that holds the substrate, the substrate stage having a reflective portion;

a driver connected to the substrate stage to drive the substrate stage;

a position detector that cooperates with the reflective portion to detect a position of the substrate stage, the position detector receiving a reflection beam from the reflective portion;

a first fluid supply device that supplies a first fluid to a first fluid passage in a first direction, the first fluid passage being formed below a passage of the reflection beam; and a second fluid supply device that supplies a second fluid to a second fluid passage in a second direction different from the first direction to cool at least part of the driver.

12. An exposure apparatus according to claim 11, wherein the first fluid is different from the second fluid.

13. An exposure apparatus according to claim 11, wherein the first fluid and the second fluid are a same fluid.

14. An exposure apparatus according to claim 11, wherein the second fluid passage is formed below the first fluid passage.

15. An exposure apparatus according to claim 11, wherein the driver comprises a coil and a magnet.

16. An exposure apparatus according to claim 15, wherein the second fluid supply device cools the coil.

17. An exposure apparatus according to claim 11, wherein the first fluid supply device prevents a fluctuation in air of the reflection beam.

* * * * *

UNITED STATES PATENT AND TRADEMARK OFFICE
CERTIFICATE OF CORRECTION

PATENT NO. : 6,555,936 B1
DATED : April 29, 2003
INVENTOR(S) : Keiichi Tanaka et al.

It is certified that error appears in the above-identified patent and that said Letters Patent is hereby corrected as shown below:

<u>Title page,</u>
Item [75], Inventors, add the following -- John K. Eaton, Stanford, CA (US) --

Signed and Sealed this

Twenty-sixth Day of August, 2003

JAMES E. ROGAN
*Director of the United States Patent and Trademark Office*